United States Patent [19]

Walls et al.

[11] Patent Number: 4,772,538
[45] Date of Patent: Sep. 20, 1988

[54] WATER DEVELOPABLE LITHOGRAPHIC COMPOSITION

[75] Inventors: John E. Walls, Hampton; Frank C. Pagano, Avenel, both of N.J.

[73] Assignee: American Hoechst Corporation, Somerville, N.J.

[21] Appl. No.: 762,090

[22] Filed: Aug. 2, 1985

[51] Int. Cl.$^4$ .................................................. G03C 1/70
[52] U.S. Cl. .................................. 430/284; 430/909; 430/288; 430/286; 430/922; 430/920; 430/281; 522/26; 522/28; 522/904; 522/121; 522/117
[58] Field of Search .............. 430/909, 288, 286, 284, 430/922, 920, 281; 522/26, 28, 904, 121, 117

[56] References Cited

U.S. PATENT DOCUMENTS

| | | | |
|---|---|---|---|
| 2,405,523 | 11/1974 | Sease et al. | 430/176 |
| 3,396,019 | 8/1968 | Uhlig | 96/33 |
| 3,619,419 | 7/1972 | Gillich | 96/91 R |
| 3,847,614 | 11/1974 | Mattor | 96/75 |
| 3,867,147 | 2/1975 | Teuscher | 96/33 |
| 3,926,643 | 12/1975 | Chang | 96/115 P |
| 3,954,475 | 5/1976 | Bonham et al. | 96/67 |
| 4,070,262 | 1/1978 | Guarino et al. | 522/26 |
| 4,115,232 | 9/1978 | Nyi et al. | 204/159.23 |

FOREIGN PATENT DOCUMENTS

| | | |
|---|---|---|
| 1144804 | 4/1983 | Canada . |
| 1153236 | 9/1983 | Canada . |
| 7410806 | 8/1974 | Netherlands . |
| 1352411 | 5/1974 | United Kingdom . |
| 0518757 | 7/1976 | U.S.S.R. . |

OTHER PUBLICATIONS

Kirk-Othmar, "Encyclopedia of Polymer Science & Technology," vol. 14, pp. 208-213, 217-230, 271.

*Primary Examiner*—Paul R. Michl
*Assistant Examiner*—Cynthia Hamilton
*Attorney, Agent, or Firm*—Richard S. Roberts

[57] ABSTRACT

This invention relates to a radiation polymerizable composition for use in a photographic element such as a lithographic printing plate comprising in admixture (a) a binder resin having the general formula

—A—B—C— wherein a plurality of each of components A, B and C occur in ordered or random sequence in the resin and wherein A is present in said resin at about 5% to about 20% by weight and comprises groups of the formula

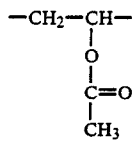

B is present in said resin at about 4% to about 30% by weight and comprises groups of the formula

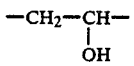

and C is present in said resin at about 50% to about 91% by weight and comprises acetal groups consisting of groups of the formulae

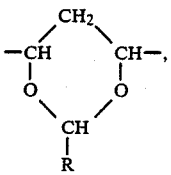 (I)

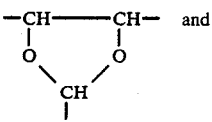

(II)

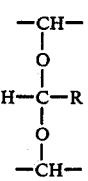

(III)

where R is lower alkyl or hydrogen, and wherein said group I is present in component C from about 75% to about 85%, group II is present in component C from about 3% to about 5%; and group III is present in component C from about 10% to about 22%;
(b) a photoinitiator;
(c) a photopolymerizable mixture of
  (1) a polyethoxylate diacrylate monomer; and
  (2) an oligomeric amine diacrylate.

25 Claims, No Drawings

WATER DEVELOPABLE LITHOGRAPHIC COMPOSITION

BACKGROUND OF THE INVENTION

The present invention relates to a radiation-polymerizable composition. More particularly, this invention relates to a radiation-polymerizable composition which may be employed to produce an improved photographic element such as a lithographic printing plate. Such plates show an increase of stability and press run life. The composition can be readily formed into adherent coatings useful in the graphic arts especially in the production of lithographic printing plates.

The use of radiation polymerizable coatings in the graphic arts is well known. Typically, the composition of such coatings can include a polymeric constituent, which may itself be radiation polymerizable, and a photosensitizer composition. Upon selected exposure of this coating to imaging energies, the radiation polymerizable species within the composition would either itself undergo a reaction or promote a reaction or degradation of one or more of the other components of the composition. It is, of course, readily appreciated that such reaction is only of value in such a system where it is essentially confined, or limited, to those areas of the composition impinged upon by such imaging energies. A negative working image thus created within the coating can then be "developed" by selective removal of the non-exposed components of the film or layer which have not been subjected to imaging energies. The ability to create such selective changes in coatings prepared from a radiation polymerizable composition has been appreciated for some time. The basic difference in the various approaches in the formulation of lithographic printing plates from radiation polymerizable compositions has been in the search for a system which is prepared from relatively inexpensive ingredients, does not require prolonged imaging energies (has a high quantum efficiency), is able to undergo an increased number of press runs, results in the creation of high resolution images within the composition which can be manifested without prolonged and elaborate development and, most significantly, may be developed with a composition which does not necesarily contain organic solvents and need only contain a minimal amount of salts and surfactants.

Most such lithographic printing plates comprise a metal substrate which is coated with a light sensitive diazonium compound in admixture with suitable binding resins, photoinitiators, photopolymerizable compositions, colorants, stabilizers, exposure indicators, surfactants and the like.

Although the art is replete with photosensitive compositions which may be used for lithographic printing plates, the prior art composition's serviceability is restricted by their limited stability and number of press runs.

It is desired to produce a composition for use in lithographic printing plates which is relatively oxygen insensitive, substantially eliminating the need to expose a screen prepared with a protective barrier layer or the addition of diazonium or cation forming compounds.

SUMMARY OF THE INVENTION

This invention relates to a radiation polymerizable composition for use in forming photographic elements such as lithographic printing plates, comprising in admixture (a) a binder resin having the general formula

—A—B—C— wherein a plurality of each of components A, B and C occur in ordered or random sequence in the resin and wherein A is present in said resin at about 5% to about 20% by weight and comprises groups of the formula

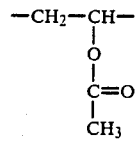

B is present in said resin at about 4% to about 30% by weight and comprises groups of the formula

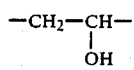

and C is present in said resin at about 50% to about 91% by weight and comprises acetal groups consisting of groups of the formulae

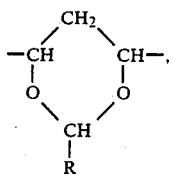 (I)

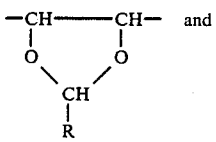 (II)

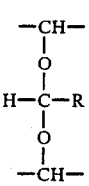 (III)

where R is lower alkyl or hydrogen, and wherein said group I is present in component C from about 75% to about 85%, group II is present in component C from about 3% to about 5%; and group III is present in component C from about 10% to about 22%;

(b) a photoinitiator; and
(c) a mixture of
(1) a polyethoxylate diacrylated monomer; and
(2) an oligomeric amine diacrylate.

DETAILED DESCRIPTION OF THE INVENTION

This invention relates to a radiation-polymerizable composition. More particularly, this invention relates to a radiation-polymerizable composition for use in forming photographic elements such as lithographic printing plates, which comprises in admixture (a) a binder resin having the general formula

—A—B—C— wherein a plurality of each of components A, B and C occur in ordered or random sequence in the resin and wherein A is present in said resin at about 5% to about 20% by weight and comprises groups of the formula

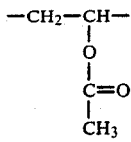

B is present in said resin at about 4% to about 30% by weight and comprises groups of the formula

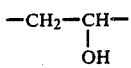

C is present in said resin at about 50% to about 91% by weight and comprises acetal groups consisting of groups of the formulae

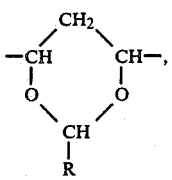  (I)

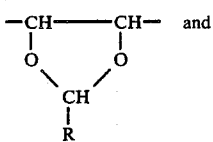  and  (II)

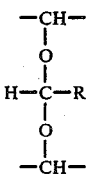  (III)

where R is lower alkyl or hydrogen, and wherein said group I is present in component C from about 75% to about 85%, group II is present in component C from about 3% to about 5%; and group III is present in component C from about 10% to about 22%;
  (b) a photoinitiator;
  (c) a mixture of
  (1) an polyethoxylate diacrylated monomer and
  (2) an oligomeric amine diacrylate.

As used in describing the resin which may be used in this invention, the term "lower alkyl" refers to a straight or branched chain hydrocarbon having from 1 to 8 carbon atoms and containing no unsaturation.

The polyvinyl alcohol/polyvinyl acetate copolymers suitable for use as a starting material for the production of the resin useful in this invention are those having from about 75% to about 80% hydrolization by weight and, preferably, an average molecular weight (AMW) of from about 5,000 to about 100,000. As used in this application hydrolization is on a weight basis and not a mole basis. Such copolymers are easily synthesized by methods known to those skilled in the art, or are commercially available. Suitable copolymers include Vinol 523 (AMW≅70,000) and Vinol 205 (AMW≅26,000) available from Air Products Co. of Allentown, Pa.; Elvanol 52-22 (AMW≅72,000) available from DuPont of Wilmington, Del.; and Gelvatol 20-30 (AMW≅10,000), Gelvatol 20-60 (AMW≅60,000), and Gelvatol 20-90 (AMW≅90,000) available from Monsanto Co. of St. Louis, Mo. Preferably, the copolymer has an average molecular weight in the range of about 50,000 to about 100,000.

In forming the resin of this invention, the copolymer is first dissolved in a solvent mixture of water and a hydroxyl group containing solvent. The hydroxyl group containing solvent must be miscible with water, it must be a solvent for the copolymer, and it must be a solvent for the final product. Preferably, the hydroxyl group containing solvent is an aliphatic alcohol. Most preferably, the alcohol is one having from about 1 to 4 carbon atoms such as ethanol. In order to ensure that the copolymer molecules of the starting material are not so intertwined with each other nor having tertiary or quaternary structure to the extent that the reaction is interfered with to a substantial degree, the copolymer is preferably dissolved in the solvent mixture for at least 12 hours at elevated temperature (preferably above 50° C.) before the reaction proceeds. This reaction mixture is then maintained at a temperature of at least 50° C. and mixed with vigorous agitation which continues throughout the reaction. Over a period of several hours, an aliphatic aldehyde is then titrated into the reaction mixture to form the acetal groups.

The process steps for preparing the foregoing resin include first dissolving a polyvinyl alcohol/polyvinyl acetate copolymer having from about 75% to about 80% hydrolization in a solvent mixture of water and a hydroxyl-group containing solvent to form a reaction solution. This is usually conducted for at least about 12 hours at a temperature of from about 20° C. to the boiling point of the solution depending on the molecular weight of the copolymer. The solution is then adjusted to at least about 50° C. while adding a catalytic amount, preferably from about 1.0% to about 1.5% by weight of an organic sulfonic or inorganic mineral acid. This is a catalytic amount of the acid and is insufficient to cause hydrolization. Titrated into the acidified mixture is an aliphatic aldehyde having the formula R-CHO, wherein R is hydrogen or lower alkyl. The aldehyde is added in an amount sufficient to produce a degree of acetal formation of from about 50% to about 91% by weight. During this titration an additional amount of said hydroxyl group containing solvent is added into said reaction mixture to prevent unwanted precipitation. Preferably one vigorously mixes said reaction mixture throughout the foregoing steps. Preferably the acid is then removed from the mixture by evaporation or the mixture is neutralized with an alkaline salt to a pH of from about 6.5 to 7.5 to quench said reaction mixture. One then effects precipitation of said reaction mixture; washes the precipitate with water; and dries the precipitate so as to have less than about 1% water residue.

The preferred aldehyde is one having the formula R-CHO, wherein R is hydrogen or lower alkyl. Most preferably the aldehyde is acetaldehyde or propionaldehyde. For use in the production of a lithographic printing plate, proprionaldehyde is preferred although acetaldehyde is particularly suited for water developable plates. The amount of aldehyde titrated into the reaction mixture is preferably from about 25% to about 100% by weight of the copolymer. More preferably the amount of aldehyde is from about 28% to about 67% by weight of the copolymer.

As the acetal groups are formed at the expense of the hydroxyl content of the copolymer, the water solubility is reduced. In order to prevent premature precipitation of the product formed, additional amounts of the hydroxyl group containing solvent used in the solvent mixture are titrated simultaneously with the aldehyde to accomodate the product's reduced water solubility and increasing solvent solubility.

In order to properly form the acetal groups, a catalytic amount of an acid is required to be present during the titrations. Preferably the acid used is an inorganic mineral acid or an organic sulfonic acid. Suitable inorganic mineral acids include hydrochloric acid, sulfuric acid and phosphoric acid. Suitable organic sulfonic acids include p-toluene sulfonic acid and stilbene disulfonic acid. Most preferably, the acid catalyst is hydrochloric acid. The acid catalyst is preferably present in the reaction mixture in the amount of from about 1.0% to about 1.5% by weight of the total reaction mixture. After the titrations are completed, the reaction mixture is neutralized with an alkaline salt in order quench the reaction mixture so as to prevent the deacetalization which may otherwise occur. The neutralization should adjust the pH of the reaction mixture to about 6.5 to about 7.5, and should preferably be 7.0. Suitable alkaline salts for the neutralization include sodium carbonate, potassium carbonate, sodium hydroxide and potassium hydroxide, with sodium carbonate being the most preferred.

After neutralization, the reaction mixture is preferably, although not necessarily, cooled to room temperature (about 22° to 25° C.) and then slowly mixed with water or other suitable compositions such as acetone or methyl ethyl ketone with continued vigorous agitation to effect precipitation. The resulting precipitate is water washed to remove all remaining acid, aldehyde and unreacted copolymer, and is then warm air dried so as to have less than 1% water residue.

The resulting resin contains acetal groups consisting of three types: six-membered cyclic acetals which are present from about 75% to 85%, five-membered cyclic acetals which are present from about 3% to 5% and intermolecular acetals which are present from about 10% to 22%. It is important for the use of this resin that all three types of acetal groups are present and in their indicated concentrations. This resin is more fully described in U.S. patent application Ser. No. 762,089, filed on even date herewith, and which is incorporated herein by reference.

Preferably, the polymeric binder is present in the composition at a percent solids level of from about 20% to about 75% by weight. A more preferred range is from about 30% to about 65% by weight and, most preferably, the polymeric binder is present at a percent solids level of from about 35% to about 50% by weight.

The mixture of unsaturated materials capable of undergoing free radical polymerization is comprised of a diacrylate monomer and an oligomeric amine diacrylate. Preferably, the mixture also contains a polyfunctional acrylate monomer and an oligomeric urethane acrylate.

The polyethoxylate diacrylated monomer suitable for use in the mixture is preferably a compound having the formula

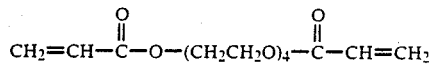

and is referred to as polyethylene glycol 200 diacrylate, which can be prepared by methods known to those skilled in the art and which is available as Photomer 4050 from Diamond Shamrock Corporation of Morristown, N.J. The diacrylate monomer is preferably present in the screen printing composition of this invention in the amount of from about 14% to about 24% by weight and, more preferably, in the amount of from about 16% to about 23% by weight. Most preferably, the diacrylate monomer is present in the screen printing composition in the amount of from about 18% to about 21% by weight.

The oligomeric amine diacrylate suitable for use in the mixture is preferably a triamine compound such as one having the formula

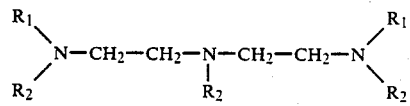

where $R_1$ is

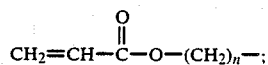

$n=0-4$ and $R_2$ is hydrogen, hydroxyl or $-(CH_2)_mOH$; $m=1-4$, which may be prepared by methods known to those skilled in the art and which is available as Celrad 7100 from Celanese Specialty Resins of Louisville, Ky. The oligomeric amine diacrylate is preferably present in the composition of this invention in the amount of from about 11.5% to about 24% by weight. More preferably, it is present in the amount of from about 16% to about 23% by weight, and, most preferably, the oligomeric amine diacrylate is present in the screen printing composition in the amount of from about 18% to about 21% by weight. It is preferred that the diacrylate monomer and the oligomeric amine diacrylate be present in the mixture in a ratio of about one-to-one.

One of the unique aspects of this invention is that the oligomeric amine diacrylate functions as both the oligomer in the photopolymer system and as the accelerator for the photoinitiator because it is a hydrogen donor due to the relatively high level of tertiary nitrogens.

As indicated, the mixture of unsaturated materials capable of undergoing free radical polymerization also preferably contains a multifunctional acrylic monomer and an oligomeric amine acrylate. Although not necessary, the addition of these two compounds provides increased strength and abrasion resistance to a screen prepared by using the composition of this invention.

The multifunctional acrylic monomer which is preferably one having two or more unsaturated groups such as trimethylolpropane triacrylate, which may be prepared by methods known to those skilled in the art and is available as SR-351 from Sartomer Company of West Chester, Pa. More preferably, the polyfunctional acrylate monomer is the ethoxylated species, trimethylolpropane ethoxylate triacrylate, which also may be prepared by methods known to those skilled in the art and is available as Photomer 4149 from Diamond Shamrock Corporation and SR-454 from Sartomer Company. Other multifunctional acrylate monomers which may be employed in the mixture used in the composition of this invention include a hexafunctional polyester acrylate, available as Photomer 5007 from Diamond Shamrock Corporation, a tetrafunctional polyester acrylate, available as Photomer 5018 from Diamond Shamrock Corporation, pentaerythritol triacrylate, pentaerythritol tetraacrylate and dipentaerythritol monohydroxy pentacrylate. Each of the foregoing can be readily prepared by methods known to those skilled in the art. When used, the multifunctional acrylate monomer is present in an amount up to about 18% by weight. More preferably, the multifunctional acrylate monomer is present in an amount of from about 9% to about 16% by weight and, most preferably, about 10% to about 14% by weight.

The oligomeric urethane acrylate which may be used in the photopolymer mixture described herein is one having one or two unsaturated groups and which may or may not be a diacrylate and preferably has the formula

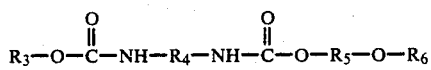

where

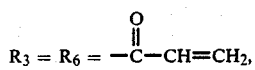

and $R_4 = R_5 = C_6H_3R_7$ wherein $R_7 = -CH_3$ or $-H$.

Such compounds are readily prepared by methods known to those skilled in the art and are available as Purelast 155A from Polymer Systems Corporation of East Brunswick, N.J. When used, the oligomeric urethane acrylate is present in an amount of up to about 18% by weight. More preferably, it is present in an amount of from about 9% to about 16% by weight and, most preferably, the oligomeric urethane acrylate is present in an amount of from about 10% to about 14% by weight. It is preferred that the multifunctional acrylic monomer and the oligomeric urethane acylate, when used, be present in the photopolymer mixture in a ratio of about one-to-one.

Suitable photoinitiators which may be used in this invention are preferably those free-radical photoinitiators having a maximum absorption range of from about 320 to about 400 nm. Examples include the acetophenones, benzophenones, triazines, benzoins, benzoin ethers, xanthones, thioxanthones, acridenes and benzoquinones. (A photoinitiator useful in preparing the composition of this invention is preferably a thioxanthone compound, most preferably 2-isopropyl-9H-thioxanthen-9-one, which may be prepared by methods known to those skilled in the art and is available as Quantacure ITX from Aceto Chemical Company of Flushing, N.Y.) More preferred of these are the triazines having the formula

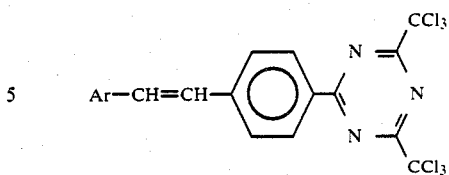

wherein Ar is

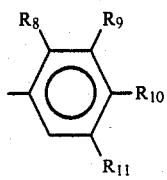

and $R_8$, $R_9$, $R_{10}$ and $R_{11}$ are, independently, hydrogen, chlorine, bromine, alkoxy, alkyl ketone, naphthyl or anthracyl, especially bis-trichloromethyl triazine. The most preferred photoinitiator is 2-stilbenyl-4,6-di(trichloromethyl) triazine.

The photoinitiator is preferably present in the composition at a percent solids level of about 1.5% to about 8.0% by weight, more preferably about 2.0% to about 6.0% by weight and is most preferably present at a percent solids level of from about 3.0% to about 4.0% by weight.

One of the significant aspects of this invention is that the photosensitive composition produced thereby may be developed with a composition which does not necessarily contain any organic solvents and which need only contain a minor amount of salts and surfactants. There is a great advantage in the elimination of organic solvents in the developer composition due to the fact that such solvents are expensive and their effluent is toxic. One of the significant aspects of this invention is that the unique combination of photoinitiator, oligomeric amine diacrylate and photopolymerizable mixture reduces the need for use of an oxygen barrier layer or the necessity for processing in a nitrogen barrier environment, although the exact mechanism for this in unclear. Among the possible advantages derived thereby is elimination of (1) the inconvenience of applying a second coating, (2) the concern over the refractive index and solubility of the oxygen barrier layer, (3) the concern over blinding on a printing press due to residue from the oxygen barrier layer, and (4) the concern over potential image gain due to the oxygen barrier layer.

Other components which may be included in the radiation-polymerizable composition of this invention include acid stabilizers, exposure indicators, plasticizers, photoactivators and colorants.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid, and mixtures thereof. Preferably, the acid stabilizer is phosphoric acid. When used, the acid stabilizer is preferably present in the radiation-polymerizable composition in the amount of from about 0.3% to about 2.0%, and most preferably from about 0.75% to about 1.5%, although the skilled artisan may use more or less as desired.

Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and substituted analogs thereof and, preferably, dioctylphthalate. The plasticizer is preferably present in the composition of this invention in an amount of from about 0.5% to about 1.25% by weight, although the skilled artisan may use more or less as desired.

Colorants useful herein include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 1.5% to about 4.0% by weight, more preferably from about 1.75% to about 3.0% and most preferably from about 2.0% to about 2.75%, although the skilled artisan may use more or less as desired.

In order to form a coating composition for the production of lithographic printing plates, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl cellosolve, alcohols such as ethanol and n-propanol, and ketones such as methyl ethyl ketone, or mixtures thereof. Preferably, the solvent comprises a mixture of tetrahydrofuran, propylene glycol monomethyl ether and butyrolactone. In general, the solvent system is evaporated from the coating composition once it is applied to an appropriate substrate, however, some insignificant amount of solvent may remain as residue.

Substrates useful for coating with the composition of this invention to form a lithographic printing plate include sheets of transparent films such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electrolyte solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the composition of the present invention and dried. A preferred coating weight ranges from about 0.6 g/m² to about 2.5 g/m² more preferably from about 0.8 g/m² to about 2.0 g/m² and most preferably from about 1.2 g/m² to about 1.5 g/m² although these coating weights are not critical to the practice of this invention.

Preferably the thusly prepared lithographic printing plate is exposed to actinic radiation through a negative test flat so as to yield a solid 6 on a 21 step Stouffer exposure wedge after development. The exposed plate is then developed with a suitable aqueous developer composition, developer such as one comprising one or more of the following groups:

(a) a sodium, potassium or lithium salt of octyl, decyl or dodecyl monosulfate;
(b) a sodium, lithium, potassium or ammonium metasilicate salt; and
(c) a lithium, potassium, sodium or ammonium borate salt; and
(d) an aliphatic dicarboxylic acid, or sodium, potassium or ammonium salt thereof having from 2 to 6 carbon atoms; and
(e) mono, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807. In conventional use, the developed plate is finished with a subtractive finisher such as a hydrophilic polymer. Examples include cold water-soluble dextrin and/or polyvinyl pyrrolidone, a nonionic surfactant, a humectant, an inorganic salt and water, as taught by U.S. Pat. No. 4,213,887.

For the purpose of improving the press performance of a plate prepared as described above, it is known that baking of the exposed and developed plate can result in an increase in the number of quality impressions over that otherwise obtainable. To properly bake the plate, it is first treated with a solution designed to prevent loss of hydrophilicity of the background during baking. An example of an effective solution is disclosed in U.S. Pat. No. 4,355,096, the disclosure of which is hereby incorporated herein by reference. The thusly prepared plate is then heat treated by baking at a temperature of from about 180° C. up to the annealing temperature of the substrate, most preferably about 240° C. The effective baking time is inversely proportional to the temperature and averages in the range of from about 2 to about 15 minutes. At 240° C. the time is about 7 minutes.

The following examples are illustrative of the invention but it is understood that the invention is not limited thereto. None of the plates plates prepared in Examples 1-3 have an oxygen barrier layer thereon nor were they processed in a nitrogen barrier environment.

In each of the following examples, the binder resin used is a binder resin having the general formula

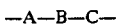

wherein a plurality of each of components A, B and C occur in ordered or random sequence in the resin and wherein A is present in said resin at about 5% to about 20% by weight and comprises groups of the formula

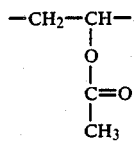

B is present in said resin at about 4% to about 30% by weight and comprises groups of the formula

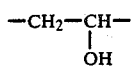

and C is present in said resin at about 50% to about 91% by weight and comprises acetal groups consisting of groups of the formulae

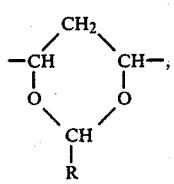 (I)

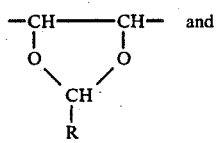 and (II)

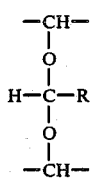 (III)

where R is lower alkyl or hydrogen, and wherein said group I is present in component C from about 75% to about 85%, group II is present in component C from about 3% to about 5%; and group III is present in component C from about 10% to about 22%.

EXAMPLE 1

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath werein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

40 parts by weight of Vinol 523, a polyvinyl alcohol/-poly-vinyl acetate copolymer which is 75% to 80% hydrolized by weight and which has an average molecular weight of 70,000, is dissolved in a mixture of 150 parts by weight of water and 120 parts by weight of n-propanol. The solution is heated to 70° C. and maintained at that temperature for 14 hours. The temperature is then reduced to 60° C. and 1.5 parts by weight of hydrochloric acid are added and 11.8 parts by weight of acetaldehyde are slowly titrated in with vigorous agitation, which continues for 6 hours to form the resin solution.

27.6 parts by weight of the resin solution (4.42 parts by weight of solids) is combined with 14.5 parts by weight of a stock solution which contains:

|  | Parts by weight |
|---|---|
| polyethylene glycol 200 diacrylate | 17.2 |
| Celrad 7100 | 17.2 |
| trimethylol propane triacrylate | 10.3 |
| Purelast 155A | 10.3 |
| 2-isopropyl-9H—thioxanthen-9-one | 0.2 |
| ethanol | 43.1 |

The coated and dried plate is exposed to actinic radiation through a negative exposure flat so as to yield a solid seven on a 21 step Stouffer step wedge. The plate is developed using tap water and finished with the following composition.

|  | % w/w |
|---|---|
| Dextrin*** | 5.52 |
| sodium octyl sulfate | 1.61 |
| Triton X-100**** | 1.00 |
| Givgaurd DXN***** | 0.05 |
| H₃PO₄ | 2.37 |
| H₂O | Balance |

***hydrolyzed tapioca dextrin
****isooctyl phenol polyoxyethylene ethanol: 4.5 moles ethylene oxide
***** 1,4-dimethyl-6-acetoxy-dioxane and run on a Heidelberg sheet fed press using abrasive ink, over-packing, and a Dahlgren dampening system until image breakdown is achieved. Under these conditions the plate provides 280,000 acceptable impressions.

EXAMPLE 2

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath werein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

40 parts by weight of Vinol 523 is dissolved in a mixture of 135 parts by weight of water and 135 parts by weight of n-propanol. The solution is heated to 70° C. and maintained at that temperature for 14 hours. The temperature is then adjusted to 60° C. and 1.5 parts by weight of hydrochloric acid are added and 11.8 parts by weight of acetaldehyde are slowly titrated in with vigorous agitation, which continues for 6 hours to form the resin solution. A portion of this solution is dried as a thin film in an exhaust hood overnight (approximately 16 hours) and then in a 55° C. vacuum oven.

5.0 parts by weight of the resulting film (assuming 80% solids) is dissolved in a mixture of 11 parts by weight of water and 11 parts by weight of n-propanol. This solution is then combined with a stock solution which contains

|  | Parts by weight |
|---|---|
| polyethylene glycol 200 diacrylate | 17.2 |
| Celrad 7100 | 17.2 |
| trimethylol propane ethoxylate triacrylate | 10.3 |
| Purelast 155A | 10.3 |
| 2-Isopropyl-9H—thioxanthen-9-one | 1.7 |
| ethanol | 43.1 |

The coated and dried plate is exposed to actinic radiation through a negative exposure flat so as to yield a solid seven on a 21 step Stouffer step wedge. The plate is developed using the following composition which has a pH of 7.3:

|  | % w/w |
|---|---|
| sodium benzoate | 6.9 |
| sodium octyl sulfate | 3.0 |
| trisodium phosphate | 2.8 |
| monosodium phosphate | 1.5 |
| H$_2$O | Balance | and finished with the following composition

|  | % w/w |
|---|---|
| Dextrin*** | 5.52 |
| sodium octyl sulfate | 1.61 |
| Triton X-100**** | 1.00 |
| Givgaurd DXN***** | 0.05 |
| H$_3$PO$_4$ | 2.37 |
| H$_2$O | Balance |

***hydrolyzed tapioca dextrin
****isooctyl phenol polyoxyethylene ethanol; 4.5 moles ethylene oxide
***** 1,4-dimethyl-6-acetoxy-dioxane and run on a Heidelberg sheet fed press using abrasive ink, over-packing, and a Dahlgren dampening system until image breakdown is achieved. Under these conditions the plate provides 305,000 acceptable impressions.

EXAMPLE 3

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath werein the aluminum is made anodic. Sufficient current and voltage is used to produce an oxide layer of 2.8 g/m$^2$. The anodized plate is well rinsed and hydrophilized by immersing the plate into a solution of polyvinyl phosphonic acid. The plate is well rinsed and dried. The thusly prepared plate is whirler coated with a solution having the following composition:

80 parts by weight of a polyvinyl alcohol/polyvinyl acetate copolymer which is 75% to 80% hydrolized by weight and which has an average molecular weight of 10,000 is dissolved in a mixture of 200 parts by weight of water and 160 parts by weight of n-propanol. The solution is heated to 70° C. and that temperature is maintained for 16 hours. The solution is then cooled to 60° C. and 1.5 parts by weight of hydrochloric acid are added and 24.3 parts by weight of acetaldehyde are slowly titrated in with vigorous agitation for 5 hours. A portion of the resin solution is dried as a thin film in like manner as Example 2.

4.5 parts by weight of this material (4.0 parts by weight of solids) is dissolved in a mixture of 11.0 parts by weight of water and 11.0 parts by weight of n-propanol and combined with 14.5 parts by weight of a stock solution which contains

|  | Parts by weight |
|---|---|
| polyethylene glycol 200 diacrylate | 27.6 |
| Celrad 7100 | 27.6 |
| 2-isopropyl-9H—thioxanthen-9-one | 1.7 |
| ethanol | 43.1 |

The coated and dried plate is exposed to actinic radiation through a negative exposure flat so as to yield a solid seven on a 21 step Stouffer step wedge. The plate is developed using tap water and finished with the following composition.

|  | % w/w |
|---|---|
| Dextrin*** | 5.52 |
| sodium octyl sulfate | 1.61 |
| Triton X-100**** | 1.00 |
| Givgaurd DXN***** | 0.05 |
| H$_3$PO$_4$ | 2.37 |
| H$_2$O | Balance |

***hydrolyzed tapioca dextrin
****isooctyl phenol polyoxyethylene ethanol; 4.5 moles ethylene oxide
***** 1,4-dimethyl-6-acetoxy-dioxane and run on a Heidelberg sheet fed press using abrasive ink, over-packing, and a Dahlgren dampening system until image breakdown is achieved. Under these conditions the plate provides 295,000 acceptable impressions.

We claim:
1. A radiation-polymerizable composition comprising in admixture
(a) a binder resin having the general formula

—A—B—C— wherein a plurality of each of components A, B and C occur in ordered or random sequence in the resin and wherein A is present in said resin at about 5% to about 20% by weight and comprises groups of the formula

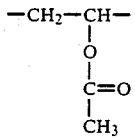

B is present in said resin at about 4% to about 30% by weight and comprises groups of the formula

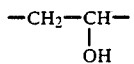

and C is present in said resin at about 50% to about 91% by weight and comprises acetal groups consisting of groups of the formulae

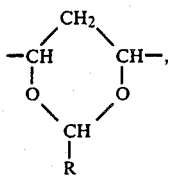 (I)

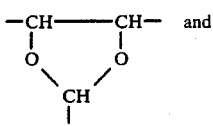 (II)

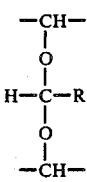 (III)

where R is lower alkyl or hydrogen, and wherein said group I is present in component C from about 75% to about 85%, group II is present in component C from about 3% to about 5%; and group III is present in component C from about 10% to about 22%;
(b) a photoinitiator; and
(c) a photopolymerizable mixture of
  (1) a polyethoxylate diacrylated monomer;
  (2) an oligomeric amine diacrylate.

2. The composition of claim 1 wherein said photopolymerizable mixture further comprises a multifunctional acrylate monomer having two or more unsaturated groups, and an oligomeric urethane acrylate having one or two unsaturated groups.

3. The composition of claim 1 wherein said polyethoxylate diacrylated monomer has the formula

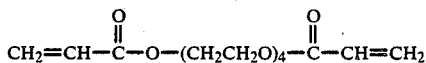

4. The composition of claim 1 wherein said oligomeric amine diacrylate has the formula

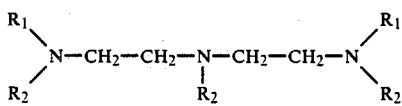

wherein $R_1$ is

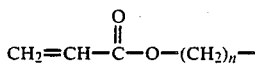

where $n=0-4$; and $R_2$ is hydrogen, hydroxyl or $-(CH_2)_mOH$ where $m=1-4$.

5. The composition of claim 2 wherein said multifunctional acrylate monomer is trimethylolpropane ethoxylate triacrylate.

6. The composition of claim 2 wherein said oligomeric urethane acrylate has the formula

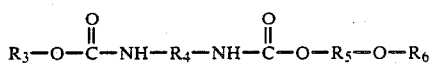

wherein

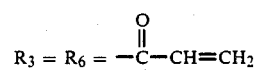

and $R_4=R_5=C_6H_3R_7$

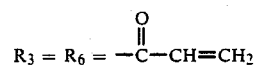

wherein $R_7=-CH_3$ or $-H$.

7. The composition of claim 1 wherein said photoinitiator is a thioxanthone compound.

8. The compound of claim 7 wherein said thioxanthone compund is 2-isopropyl-9H-thioxanthen-9-one.

9. The composition of claim 1 wherein said photoinitiator comprises a triazine compound.

10. The composition of claim 9 wherein said photoinitiator comprises a bis-trichloromethyl triazine having the formula

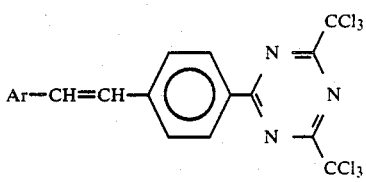

wherein Ar is

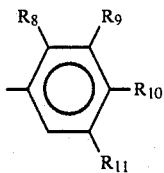

and $R_8$, $R_9$, $R_{10}$, and $R_{11}$ are, independently, hydrogen, chlorine, bromine, alkoxy, alkyl ketone, naphthyl or anthracyl.

11. The composition of claim 10 wherein said photoinitiator is 2-stilbenyl-4,6-di(trichloromethyl)triazine.

12. The composition of claim 1 wherein R is ethyl.

13. The composition of claim 1 wherein R is methyl.

14. The composition of claim 1 wherein said binder resin is present at from about 8% to about 18% by weight.

15. The composition of claim 14 wherein said binder resin is present at from about 10% to about 12% by weight.

16. The composition of claim 1 wherein said diacrylate monomer is present at from about 4% to about 14% by weight.

17. The composition of claim 16 wherein said diacylate monomer is present at from about 5% to about 7% by weight.

18. The composition of claim 1 wherein said oligomeric amine diacrylate is present at from about 1.5% to about 14% by weight.

19. The composition of claim 18 wherein said oligomeric amine diacrylate is present at from about 5% to about 7% by weight.

20. The composition of claim 2 wherein said multifunctional acrylate monomer is present at up to about 12% by weight.

21. The composition of claim 20 wherein said multifunctional acrylate monomer is present at from about 2% to about 4% by weight.

22. The composition of claim 2 wherein said oligomeric urethane acrylate is present at up to about 12% by weight.

23. The composition of claim 22 wherein said oligomeric urethane acrylate is present at from about 2% to about 4% by weight.

24. The composition of claim 7 wherein said triazine compound is present at from about 0.2% to about 1.0% by weight.

25. The composition of claim 24 wherein said triazine compound is present at from about 0.5% to about 0.7% by weight.

* * * * *